(12) United States Patent  (10) Patent No.: US 7,434,122 B2
Jo  (45) Date of Patent: Oct. 7, 2008

(54) FLASH MEMORY DEVICE FOR PERFORMING BAD BLOCK MANAGEMENT AND METHOD OF PERFORMING BAD BLOCK MANAGEMENT OF FLASH MEMORY DEVICE

(75) Inventor: Seong-Kue Jo, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 608 days.

(21) Appl. No.: 11/056,844

(22) Filed: Feb. 11, 2005

(65) Prior Publication Data

US 2006/0031710 A1  Feb. 9, 2006

(30) Foreign Application Priority Data

Aug. 4, 2004  (KR) ........................ 10-2004-0061297

(51) Int. Cl.
*G11C 29/00* (2006.01)

(52) U.S. Cl. ............................... 714/723; 714/710

(58) Field of Classification Search ................ 714/723, 714/718, 710, 711; 365/185.33, 185.09, 365/185.29, 200, 201; 711/103
See application file for complete search history.

(56) References Cited

U.S. PATENT DOCUMENTS

| | | | |
|---|---|---|---|
| 5,848,009 A | 12/1998 | Lee et al. | |
| 6,016,275 A * | 1/2000 | Han | 365/185.29 |
| 6,128,695 A * | 10/2000 | Estakhri et al. | 711/103 |
| 6,288,940 B1 | 9/2001 | Kawamura | |
| 6,684,345 B2 | 1/2004 | Harari et al. | |
| 7,079,417 B2 * | 7/2006 | Nam et al. | 365/185.13 |

FOREIGN PATENT DOCUMENTS

| | | |
|---|---|---|
| JP | 7-201196 | 8/1995 |
| KR | 1999-55972 | 7/1999 |
| KR | 2000-70451 | 11/2000 |

OTHER PUBLICATIONS

English language abstract of Japanese Publication No. 7-201196.
English language abstract of Korean Publication No. 1999-55972.
English language abstract of Korean Publication No. 2000-70451.

* cited by examiner

*Primary Examiner*—Phung M Chung
(74) *Attorney, Agent, or Firm*—Marger Johnson & McCollom, P.C.

(57) ABSTRACT

A flash memory device for performing a bad block management and a method of performing bad block management are implemented in hardware level. During a booting procedure of a flash memory device, a bad block-mapping table stored in a predetermined block of memory cell array unit or other nonvolatile memory is stored in a bad block mapping register via a bad block-mapping table loader. An address selector receives a logical address from an external device and compares the logical address with a bad block address stored in the bad block mapping register. A bad block-state controller determines a count number of a re-mapping mark and outputs a re-mapping mark flag to the address selector. The address selector selects a logical address or a bad block address received from the bad block mapping register as a physical address and outputs the physical address to the memory cell array unit.

15 Claims, 5 Drawing Sheets

FIG. 2

| 11 | BAD BLOCK ADDRESS 1 | RESERVED BLOCK ADDRESS 0 |
|---|---|---|
| 11 | BAD BLOCK ADDRESS 2 | RESERVED BLOCK ADDRESS 1 |
| 00 | 000_0000_0000_0000 | RESERVED BLOCK ADDRESS 2 |
| 00 | 000_0000_0000_0000 | RESERVED BLOCK ADDRESS 3 |
| ⋮ | ⋮ | ⋮ |
| | 000_0000_0000_0000 | RESERVED BLOCK ADDERSS N |

FLASH MEMORY DEVICE FOR PERFORMING BAD BLOCK MANAGEMENT AND METHOD OF PERFORMING BAD BLOCK MANAGEMENT OF FLASH MEMORY DEVICE

CROSS REFERENCE TO RELATED APPLICATIONS

This application claims priority of Korean Patent Application No. 2004-61297, filed on Aug. 4, 2004 in the Korean Intellectual Property Office (KIPO), the entire contents of which are hereby incorporated by reference.

BACKGROUND OF THE INVENTION

1. Field of the Invention

The present disclosure relates to non-volatile semiconductor memory devices and in particular to flash memory devices for managing bad memory blocks and a method of managing bad memory blocks of flash memory devices.

2. Description of the Related Art

A flash memory device is a type of non-volatile semiconductor device where data are written or erased electrically. Flash memory devices are widely used for portable devices.

In general, a memory cell array of a flash memory device includes multiple blocks (sometimes called sectors.) and each of the blocks includes multiple pages.

A block is a minimum unit for erasing data stored in memory cells.

As the integration density of integrated flash memory devices has increased, it has become more difficult to fabricate integrated circuit memory devices that are completely free of defective memory cells.

In redundancy technology, a defective memory block is replaced with a redundant memory block.

Memory devices that employ redundancy technology identify defective block addresses, and inhibit write or read operations at the defective address.

In addition, the redundant memory block having a predetermined physical address is substituted for the defective memory block and write or read operation is performed at the redundant memory block.

A conventional redundancy technology is disclosed in U.S. Pat. No. 6,288,940.

According to U.S. Pat. No. 6,288,940, a non-volatile semiconductor memory device that employs the conventional redundancy technology has a storage unit and an access inhibiting circuit. The storage unit stores defect information of defective blocks. The access inhibiting circuit judges the condition of the memory cell unit based on the defect information stored in the storage unit to inhibit access to the memory cell unit.

In order to perform write or read operations on the memory cells of the flash memory device, address and data are provided from an external firmware and the access inhibiting circuit compares the defective block address stored in the storage unit with a physical block address provided from the external firmware.

When the physical block address provided from the external firmware is identical to the defective block address, the access inhibiting circuit inhibits write or read operations on the defective block, and the external firmware provides new address and data to the memory device.

According to the conventional defective block management, the firmware has excessively many commands (or codes) that provide addresses and change the defective block address to a new address.

In addition, according as the firmware codes are more complex, total performance of system using the flash memory device may be further degraded. Embodiments of the invention address these and other limitations in the prior art.

SUMMARY OF THE INVENTION

Accordingly, features of the present invention substantially obviate one or more problems due to limitations and disadvantages of the related art.

It is a first feature of the present invention to provide a flash memory device for performing bad block management implemented in hardware level.

It is a second feature of the present invention to provide a method of performing the bad block management of the flash memory device.

In one embodiment of the present invention, there is provided a flash memory device including: a memory cell array unit for storing data and defective block information; a bad block mapping register for temporarily storing the defective block and reserved block information corresponding to the defective block; an address comparator for comparing a first address provided from an external device with a second address corresponding to the defective block; and a bad block-state controller for controlling the memory cell array unit, the bad block mapping register and the address comparator.

In another embodiment of the present invention, there is provided a method of performing defective block management of a flash memory device including: receiving a logical address; determining a count number of a re-mapping mark; when the count number is a first predetermined quantity, providing the logical address to the memory cell array unit; when the count number is a second predetermined quantity, determining whether the logical address is identical to a defective block address; when the logical address is identical to a defective block address, selecting a reserved block address corresponding to the logical address and providing the reserved block address to the memory cell array unit; and when the logical address is not identical to a defective block address, providing the logical address to the memory cell array unit.

In still another embodiment of the present invention, there is provided a method of performing defective block management of a flash memory device including: determining whether a memory block in the flash memory device is defective; when the memory block in the flash memory device is not defective, performing a first write operation on the flash memory device; when the memory block in the flash memory device is defective, providing a defective block information to a bad block mapping register; based on the defective block information, performing an operation on the flash memory device; and storing the defective block information stored in the bad block mapping register to the memory cell array unit.

According to the exemplary embodiments of the present invention, the defective block management of the flash memory device may be implemented in a hardware level instead of in a software level; therefore, the time required for managing defective blocks may be shortened.

In addition, as the firmware codes are reduced, a complexity of the firmware may be lowered.

BRIEF DESCRIPTION OF THE DRAWINGS

The above and other features and advantages of the present invention will become more apparent by describing in detail exemplary embodiments thereof with reference to the accompanying drawings, in which:

FIG. 2 is a block diagram showing a bad block-mapping table shown in FIG. 1;

DETAILED DESCRIPTION OF THE INVENTION

Figure 1:
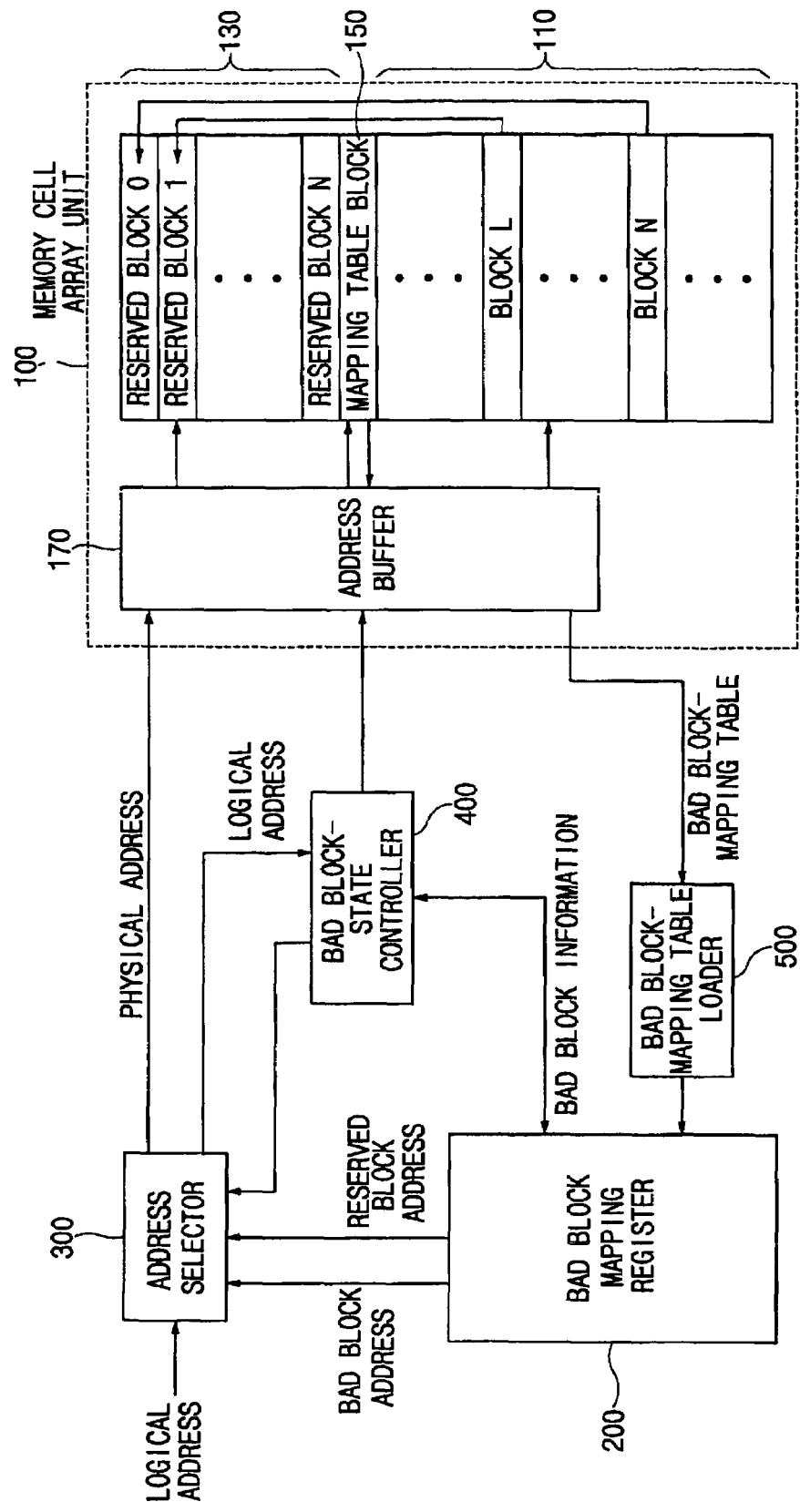
FIG. 1 is a block diagram showing a flash memory device according to an exemplary embodiment of the present invention.

Detailed illustrative embodiments of the present invention are disclosed herein. However, specific structural and functional details disclosed herein are merely representative for purposes of describing exemplary embodiments of the present invention. This invention may, however, be embodied in many alternate forms and should not be construed as limited to the embodiments set forth herein.

Accordingly, while the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention. Like numbers refer to like elements throughout the description of the figures.

It should also be noted that in some alternative implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved.

FIG. 1 is a block diagram showing a flash memory device according to an exemplary embodiment of the present invention.

Referring to FIG. 1, the flash memory device includes a memory cell array unit 100, a bad block mapping register 200, an address selector 300 and a bad block-state controller 400.

The memory cell array unit 100 includes multiple blocks.

Each of the blocks of the memory cell array has a respectively assigned address; therefore each of the blocks has a unique address.

The memory cell array unit 100 includes data storage blocks 110 for storing data, reserved blocks 130 for replacing the bad blocks and a mapping table block 150 for storing bad block information.

In order to perform an erase or programming operation on the memory cell array unit 100, a particular block or a page in the particular block is accessed according to a physical address provided to the memory cell array unit 100 from an address buffer 170.

A read operation is used so as to verify whether a memory cell in a predetermined block normally operates or not.

According to the result of verification, the bad block is replaced with the reserved block and access to the bad block is inhibited.

Further, the bad block information is stored in the mapping table block 150 or any other nonvolatile memory including memory physically separated from the memory cell array unit 100.

The bad block information has a form of a bad block-mapping table.

The bad block-mapping table includes a re-mapping mark for indicating whether the predetermined block of the memory cell array unit 100 normally operates or not, a physical block address and a reserved block address corresponding to the physical block address.

The bad block mapping register 200 includes multiple registers and stores the bad block-mapping table.

The address selector 300 compares a logical address received from an external device with the bad block address of the bad block-mapping table based on the bad block-mapping table stored in the bad block mapping register 200.

The comparison operation may be repeated based on the number of the re-mapping mark of the bad block-mapping table.

In addition, the address selector 300 selects the logical address received from the external device or the reserved block address as a physical address based on the result of comparison and the bad block information.

The fact that the number of the re-mapping mark is equal to zero indicates that the bad block does not exist in the memory cell array unit 100, therefore, the physical address that is identical to the logical address may be provided to the memory cell array unit 100 regardless of the comparison operation.

When the logical address is identical to the physical address and the number of the re-mapping mark is greater than or equal to '1', the address selector 300 selects the reserved block address supplied from bad block-mapping register 200 as a physical address and outputs the reserved block address to the memory cell array unit 100.

The bad block-state controller 400 generates a re-mapping mark flag used in an address select operation of the address selector 300.

The re-mapping mark flag is set to a high level when the number of the re-mapping mark stored in the bad block register 200 is greater than or equal to '1'.

Further, when a block (or blocks) that is designated by the logical address received from the external device is judged as a bad block, the bad block-mapping table stored in the bad block mapping register 200 is updated.

Furthermore, the bad block-state controller 400 stores the bad block-mapping table of the bad block mapping register 200 into the mapping table block 150 of the memory cell array unit 100 in case the bad block-mapping table in the bad block mapping register 200 is erased due to a power-off of the flash memory device.

The flash memory device may further include a bad block-mapping table loader 500.

At the first booting process, the bad block-mapping table loader 500 loads the bad block information stored in the memory cell array unit 100 into the bad block mapping register 200.

When access to the flash memory device is complete, the bad block information in the bad block mapping register 200 is stored into the mapping table block 150 in the memory cell array unit 100.

Although the flash memory device is powered-off, the bad block information of the bad block-mapping table in the memory cell array unit 100 is not erased.

Accordingly, during a booting procedure of the flash memory device, the bad block-mapping table stored in the memory cell array unit 100 is stored in the bad block mapping register 200 via the bad block-mapping table loader 500.

FIG. 2 is a block diagram showing a bad block-mapping table shown in FIG. 1.

Referring to FIG. 2, the bad block-mapping table includes a re-mapping mark, a bad block address and a reserved block address.

The re-mapping mark indicates whether blocks of the memory cells are defective or not.

In FIG. 2, the re-mapping mark is composed of 2 bits; however, the number of bits may be variable.

The bad block address designates an address of the defective block that does not normally operate among storage blocks of the memory cell array unit 100.

When the bad block is generated at the storage block in the memory cell array unit, the bad block address is stored into the bad block-mapping table in the memory cell array unit 100 and the reserved block address corresponding to the bad block address is decided.

The reserved block address represents an address that designates a predetermined reserved block for replacing the defective block when the defective block is generated at the storage block in the memory cell array unit 100.

After an erase or programming operation, in which 'block 1' corresponding to 'address 1' is accessed, is completed, the flash memory device verifies whether the 'block 1' normally operates or not.

When the 'block 1' is judged as the defective block, the bad block-state controller 400 stores the 'address 1' having the address of the defective 'block 1' into the bad block mapping register and sets the re-mapping mark as '11' for the 'address 1'.

When the logical address received from the external device refers to the 'block 1', the physical address provided to the memory cell array unit 100 refers to the 'reserved block address 0' since the bad block-mapping table stored in the bad block mapping register 200 includes reserved block addresses correspondingly allocated.

In addition, after an erase or programming operation is performed on 'block 2', the bad block-state controller 400 stores 'address 2' having an address of defective 'block 2' into the bad block mapping register 200 and sets the re-mapping mark '11' for the 'address 2' when the 'block 2' is judged as the defective block.

When the logical address received from the external device refers to the 'block 2', the physical address provided to the memory cell array unit 100 refers to the 'reserved block address 1'.

Figure 3:
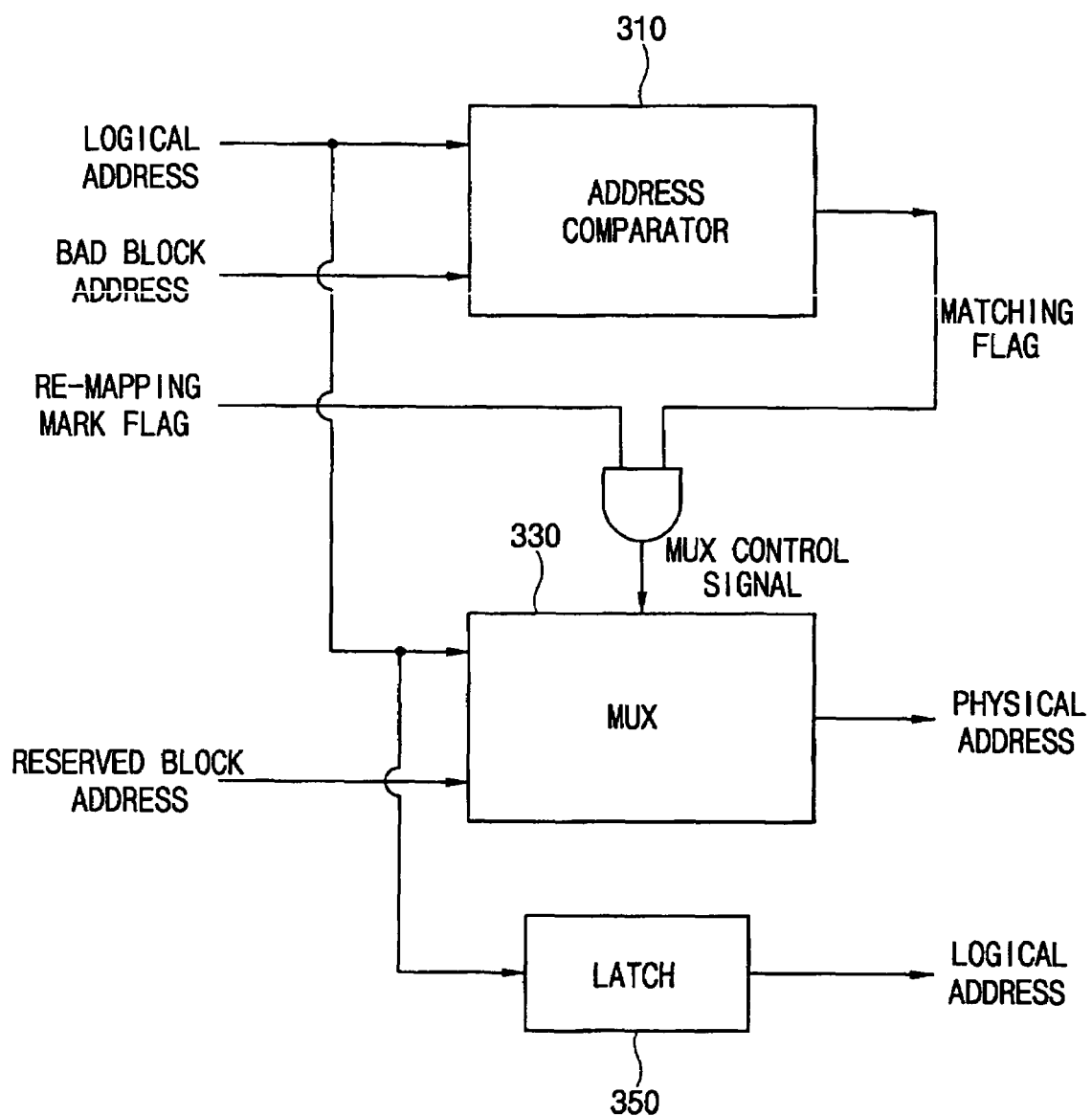
FIG. 3 is a block diagram showing an address selector shown in FIG. 1.

FIG. 3 is a block diagram showing an address selector shown in FIG. 1.

Referring to FIG. 3, an address selector 300 includes an address comparator 310, a MUX 330, a latch 350.

The address comparator 310 compares the logical address received from the external device with the bad block address stored in the bad block mapping register 200.

The address comparator 310 outputs a matching flag signal as a result of the comparison operation.

When the logical address is identical to the bad block address, the address comparator 310 generates the matching flag signal of a high level.

In addition, when the logical address is not identical to the bad block address, the address comparator 310 generates the matching flag signal of a low level.

The MUX 330 receives the logical address and reserved block address from the external device and outputs one address as a physical address selected from the logical address or the reserved block address.

The MUX control signal is generated by a logical AND operation on a matching flag received from the address comparator 310 and the re-mapping mark flag received from the bad block-state controller 400.

That is, in FIG. 2, when the re-mapping mark of the bad block-mapping table is set to as '11', the re-mapping mark flag has a high level, thereafter, and the MUX control signal has a high level.

When the MUX control signal has a high level, the MUX 330 outputs the reserved block address as a physical address to the address buffer 170. When the MUX control signal has a low level, the MUX 330 outputs the logical address as a physical address to the address buffer 170.

The latch 350 stores the logical address received from the external device.

When the logical address selected as a physical address is provided to the memory cell array unit, a block corresponding to the physical address is accessed.

After erase or programming operations is performed on a block, the block is checked on whether the block normally operates or not.

When the accessed block is judged as the defective block, the logical address stored in the latch 350 is outputted to the bad block mapping register 200 via the bad block-state controller 400.

The bad block mapping register 200 stores the re-mapping mark received from the bad block-state controller 400 and the logical address stored in the latch 350.

Figure 4:
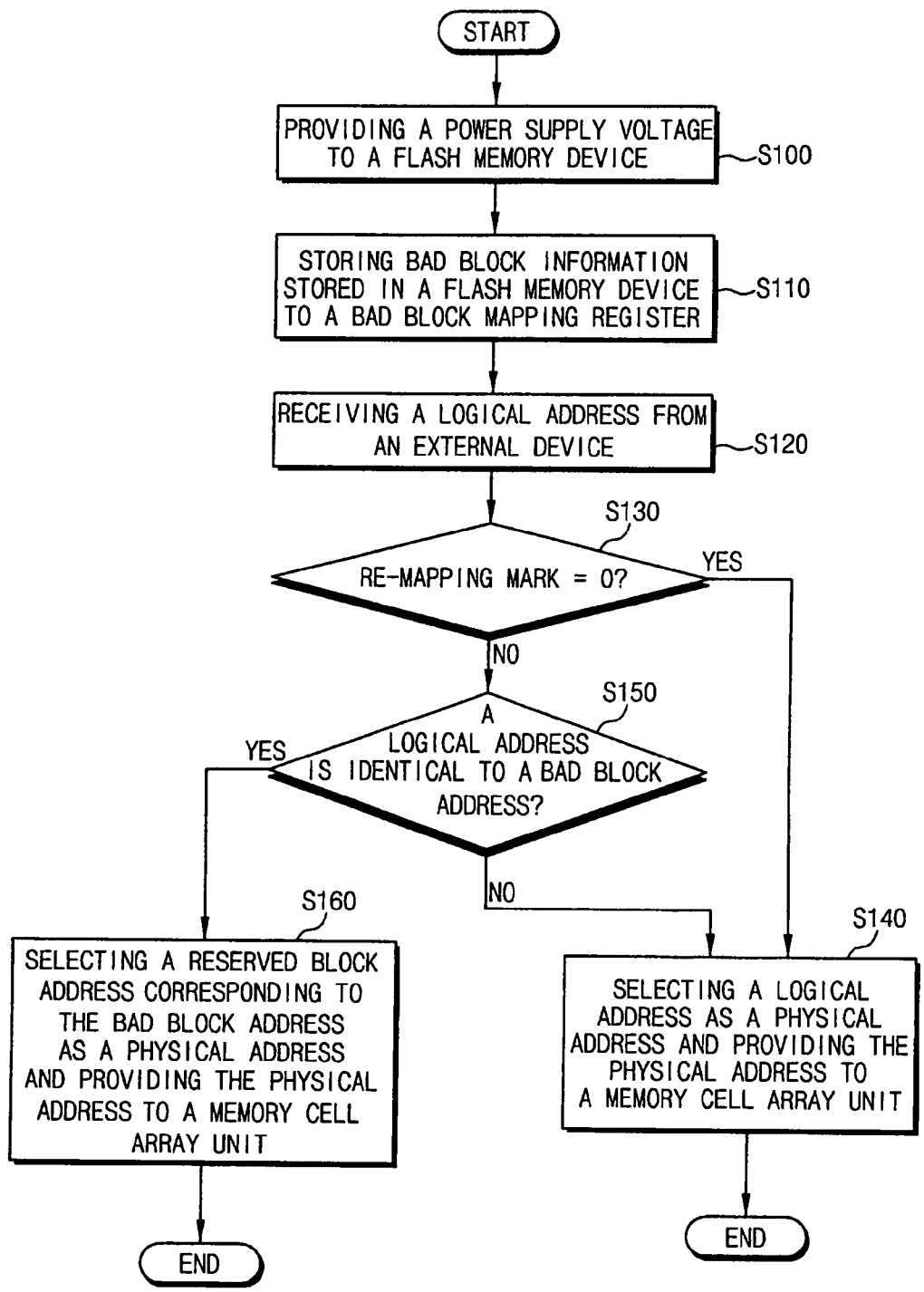
FIG. 4 is a flow chart showing a process of managing addresses of the flash memory device in case a power supply voltage is applied to the flash memory device.

FIG. 4 is a flow chart showing a process of managing addresses of the flash memory device in case a power supply voltage is applied to a flash memory device.

Referring to FIG. 4 and FIG. 1, when a power supply voltage is supplied to the flash memory device that has a power off state, a booting process begins (S100).

When the flash memory device has the power-off state, the address selector 310 does not compare the logical address with the bad block address since the bad block information stored in the bad block mapping register 200 is erased already.

However, the bad block information stored in the memory cell array unit 100 is maintained, accordingly, the bad block-mapping table stored in the mapping table block 150 of the memory cell array unit is not erased.

When the flash memory device begins a booting procedure, the bad block-mapping table loader 500 loads the bad block-mapping table stored in the mapping table block 150 into the bad block mapping register 200, (S110).

Subsequently, the address selector 300 receives the logical address from the external device (S120).

Thereafter, the bad block-state controller 400 counts the number of the re-mapping mark of the bad block-mapping table stored in the bad block mapping register 200, (S130).

When the number of the re-mapping mark is equal to zero, the address selector 300 selects the logical address as a physical address and provides the physical address to the memory cell array unit 100, (S140).

In addition, when the number of the re-mapping mark is not equal to zero, the bad block-state controller 400 generates the re-mapping mark flag.

The address comparator 300 compares the logical address received from the external device with the bad block address received from the bad block mapping register 200 based on a value of the re-mapping mark flag (S150).

When the logical address is identical to the physical address according to a result of the comparison, the address selector 300 selects a reserved block address corresponding to the bad block address as a physical address and provides the selected physical address to the memory cell array unit 100, (S160).

Further, when the logical address is not identical to the physical address, the address selector 300 selects the logical address as a physical address and provides the selected logical address to the memory cell array unit 100, (S140).

The bad block-state controller 400 counts the number of the re-mapping mark, and generates the re-mapping mark flag corresponding to the number of the re-mapping mark to repeats the comparison operation as many as the number of the re-mapping mark flag.

In addition, the process of managing addresses of flash memory device of FIG. 4 may further include a step in which the logical address is stored into the memory cell array unit 100 after the logical address is provided to the flash memory device.

Figure 5:
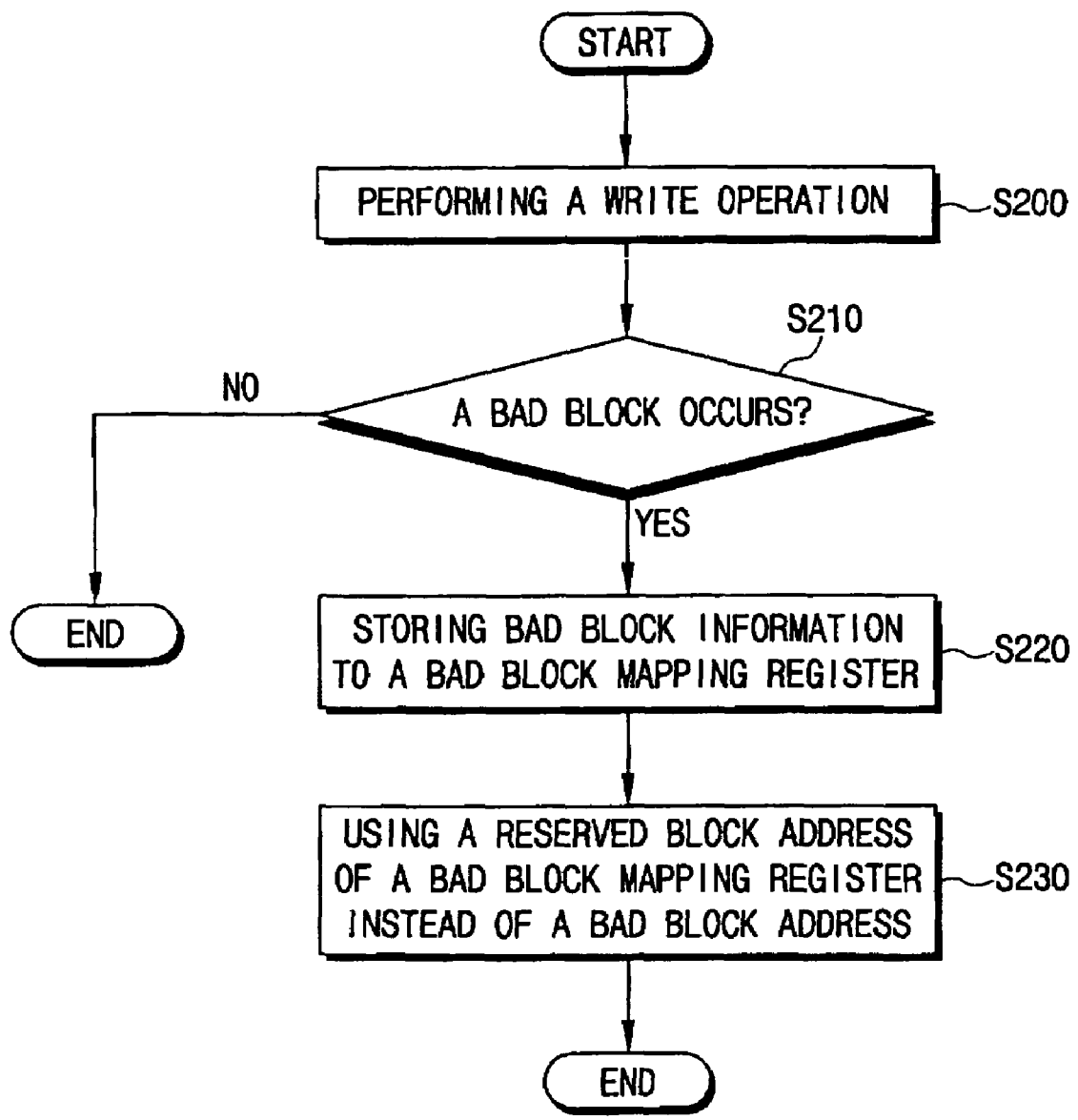
FIG. 5 is a flow chart showing a process of managing addresses of the flash memory device in case of a normal operation.

FIG. 5 is a flow chart showing a process of managing addresses of the flash memory device in case of a normal operation.

Referring to FIG. 5 and FIG. 1, a normal operation of the flash memory device indicates that write or read operation normally operates after the booting process.

The write operation is performed on a predetermined block corresponding to a particular address provided to the memory cell array unit 100, (S200).

The write operation includes receiving the logical address from the external device, selecting the logical address or a reserved block address as a physical address based on the re-mapping mark flag, storing the logical address into the latch, and performing the erase or programming operation on the particular block corresponding to the physical address.

That is, the logical address received from the external device is provided to the address selector 300 of FIG. 1.

In addition, the bad block-state controller 400 counts the number of the re-mapping mark of the bad block mapping register 200.

When the number of the re-mapping mark is greater than or equal to '1', the bad block-state controller 400 generates the re-mapping mark flag that indicates the existence of a bad block in the memory cell array unit 100.

The address comparator 310 compares the logical address with the bad block address received from the bad block mapping register 200.

When the logical address is identical to the bad block address, the address comparator 310 generates the matching flag of a high level, and the MUX control signal is generated by logical AND operation on the matching flag and re-mapping mark flag.

The MUX 330 selects the logical address or the reserved block address as a physical address based on the MUX control signal and outputs the physical address to the memory cell array unit 100.

In other words, when the re-mapping mark flag indicating whether the re-mapping mark of the bad block-mapping table stored in the bad block mapping register 200 has bad block address or not is set to the low level or the matching flag indicating whether the logical address is identical to the bad block address or not is set to the low level, the MUX 330 selects the logical address as a physical address.

In addition, when the re-mapping mark flag and the matching flag are set to as the high level, the MUX 330 selects the reserved block address as the physical address and outputs the physical address to the memory cell array unit 100.

The logical address is stored in the latch 350 regardless of the comparison operation in which the logical address and the bad block address are compared with each other, and regardless of the select operation in which one of the logical address and reserved block address is selected by the MUX 330.

A block is verified whether the block normally operates or not after the physical address is provided to the memory cell array unit 100 and the block corresponding to the physical address is accessed (S210).

When the block is judged as a non-defective memory block according to the result of the verification, the flash memory device provides a new logical address to access data corresponding to the new block address.

In addition, when the flash memory device is powered-off after the multiple blocks are accessed, the bad block-mapping table stored in the bad block mapping register 200 is stored in the mapping table block 150 of the memory cell array unit 100 via the bad block-state controller 400.

When the block corresponding to the physical address is judged as the defective block, the bad block information is stored in the bad block mapping register 200, (S220).

In other words, when the block of which data are accessed is judged as the defective block after the logical address is selected as a physical address and the physical address is provided to the memory cell array unit 100, the logical address stored in the latch 350 is a new bad block address.

The new bad block address is stored in the bad block mapping register 200 by the bad block-state controller 400.

The bad block-state controller 400 outputs the bad block address and the re-mapping mark to the bad block mapping register 200.

In processes in which the logical address are provided to the address selector 300 and data are accessed, the reserved block address corresponding to the bad block address is selected as the physical address when the logical address inputted to the address selector 300 is identical to the bad block address (S230), and the physical address is provided to the memory cell array unit 100.

In addition, when the flash memory device is powered-off after the multiple blocks are accessed, the bad block-mapping table stored in the bad block mapping register 200 is stored in the mapping table block 150 of the memory cell array unit 100 via the bad block-state controller 400.

In addition, although not illustrated in FIG. 5, a copies-back step in which data stored in valid pages of the bad block are copied to the reserved block may be intervened after the step S220 in which the bad block information is stored in the bad block mapping register.

According to the exemplary embodiments of the present invention, the bad block management of the flash memory device may be implemented in a hardware level instead of in a software level.

As a result, the bad block management implemented in the hardware level may prevent a lower performance of the flash memory device due to excessively many codes of the firmware.

While the exemplary embodiments of the present invention and their advantages have been described in detail, it should be understood that various changes, substitutions and alterations may be made herein without departing from the scope of the invention.

I claim:

1. A flash memory device comprising:
   a memory cell array unit configured to store data and defective block information;

a bad block mapping register configured to temporarily store the defective block information;

an address selector configured to select a provided logical address or a reserved block address corresponding to the logical address; and a bad block-state controller configured to update the defective block information including a defective block address stored in the bad block mapping register, configured to determine a count number of the defective block address stored in the bad block mapping register to control selection by the address selector, and configured to provide the defective block information to the memory cell array unit.

2. The flash memory device of claim 1, wherein the memory cell array unit comprises:

a plurality of data storage blocks for storing the data;

a plurality of reserved blocks configured to replace at least one defective block among the data storage blocks; and a mapping table block configured to store the defective block information.

3. The flash memory device of claim 1, wherein the defective block information comprises:

the defective block address corresponding to a defective block;

a reserved block address corresponding to the defective block address; and a re-mapping mark for identifying the defective block address.

4. The flash memory device of claim 1, further comprising a bad block mapping table loader configured to provide the defective block information stored in the memory cell array unit to the bad block mapping register during a booting procedure.

5. The flash memory device of claim 1, wherein the address selector comprises:

an address comparator configured to compare the logical address with the defective block address;

a MUX configured to select the logical address or the reserved block address; and a latch configured to store the logical address.

6. The flash memory device of claim 5, wherein a frequency of the comparison operation of the address comparator corresponds to a count number of a re-mapping mark determined by the bad block-state controller.

7. A method of performing a defective block management of a flash memory device, comprising:

receiving a logical address;

determining a count number of a re-mapping mark;

when the count number is a first predetermined quantity, providing the logical address to a memory cell array unit;

when the count number is a second predetermined quantity, determining whether the logical address is identical to a defective block address;

when the logical address is identical to the defective block address, selecting a reserved block address corresponding to the logical address and providing the reserved block address to the memory cell array unit; and when the logical address is not identical to the defective block address, providing the logical address to the memory cell array unit.

8. A method of performing a defective block management of a flash memory device, comprising:

determining whether a memory block in the flash memory device is defective;

when the memory block in the flash memory device is not defective, performing a first write operation on the flash memory device;

when the memory block in the flash memory device is defective, providing defective block information to (a) a volatile bad block mapping register and (b) a non-volatile mapping table block; and performing at least one of a second write operation and a read operation on the flash memory device responsive to the defective block information stored in the volatile bad block mapping register.

9. The method of claim 8, further comprising providing the defective block information from the volatile bad block mapping register to the non-volatile mapping table block when access to the flash memory device is completed.

10. The method of claim 8, further comprising providing the defective block information from the non-volatile mapping table block to the volatile bad block mapping register when the flash memory device is booted.

11. The method of claim 8, wherein said determining whether a memory block in the flash memory device is defective further comprises:

receiving a logical address;

determining a count number of a re-mapping mark;

when the count number is a first predetermined quantity, determining that the memory block in the flash memory device is not defective; and when the count number is a second predetermined quantity, determining whether the memory block in the flash memory device is defective.

12. The method of claim 11, wherein said determining whether the memory block in the flash memory device is defective comprises:

determining whether the logical address is identical to a defective block address;

when the logical address is identical to the defective block address, selecting a reserved block address corresponding to the logical address and providing the reserved block address to a memory cell array unit; and when the logical address is not identical to the defective block address, providing the logical address to the memory cell array unit.

13. The method of claim 11, further comprising:

providing the flash memory device with a power supply voltage; and providing the defective block information stored in a non-volatile memory unit to the bad block mapping register.

14. The method of claim 11, further comprising:

after performing the at least one second write operation and read operation on a block of the flash memory device, determining whether the block operates normally.

15. The method of claim 8, further comprising providing data stored in a valid page of a defective block to a reserved block after providing the defective block information to the bad block mapping register.

* * * * *